United States Patent [19]

Ong et al.

[11] Patent Number: 4,843,026

[45] Date of Patent: Jun. 27, 1989

[54] ARCHITECTURE MODIFICATION FOR IMPROVED ROM SECURITY

[75] Inventors: Dewitt Ong, Tempe; Scott Rider, Chandler, both of Ariz.

[73] Assignee: Intel Corporation, Santa Clara, Calif.

[21] Appl. No.: 101,206

[22] Filed: Sep. 24, 1987

[51] Int. Cl.[4] ............... H01L 21/265; H01L 21/70
[52] U.S. Cl. ............................... 437/51; 437/45; 365/185
[58] Field of Search ............... 437/51, 56, 57, 48, 437/45, 229; 357/45, 23.12; 365/185

[56] References Cited

U.S. PATENT DOCUMENTS

| | | | |
|---|---|---|---|
| 3,928,082 | 12/1975 | Schwettman et al. | 437/51 |
| 4,009,057 | 2/1977 | de Brebisson et al. | 437/51 |
| 4,129,936 | 12/1978 | Takei | 437/48 |
| 4,268,950 | 5/1981 | Chatterjee et al. | 437/48 |
| 4,359,817 | 11/1982 | Dickman et al. | 437/48 |
| 4,513,494 | 4/1985 | Batra | 437/48 |
| 4,591,891 | 5/1986 | Chatterjee et al. | 437/48 |
| 4,633,572 | 1/1987 | Rusch et al. | 437/48 |
| 4,698,750 | 10/1987 | Wilkie et al. | 365/185 |

Primary Examiner—Brian E. Hearn
Assistant Examiner—Tom Thomas
Attorney, Agent, or Firm—Blakely, Sokoloff, Taylor & Zafman

[57] ABSTRACT

A technique of modifying a ROM mask to prevent external access of internal memory of an integrated circuit device. Patterns in the ROM mask are altered to permit implantation of components of a driver circuit such that these driver circuits are disabled. Disabling of the driver circuit prevents control signals from permitting external access of internal memory, therein allowing copy protection of the contents of the internal memory.

4 Claims, 3 Drawing Sheets

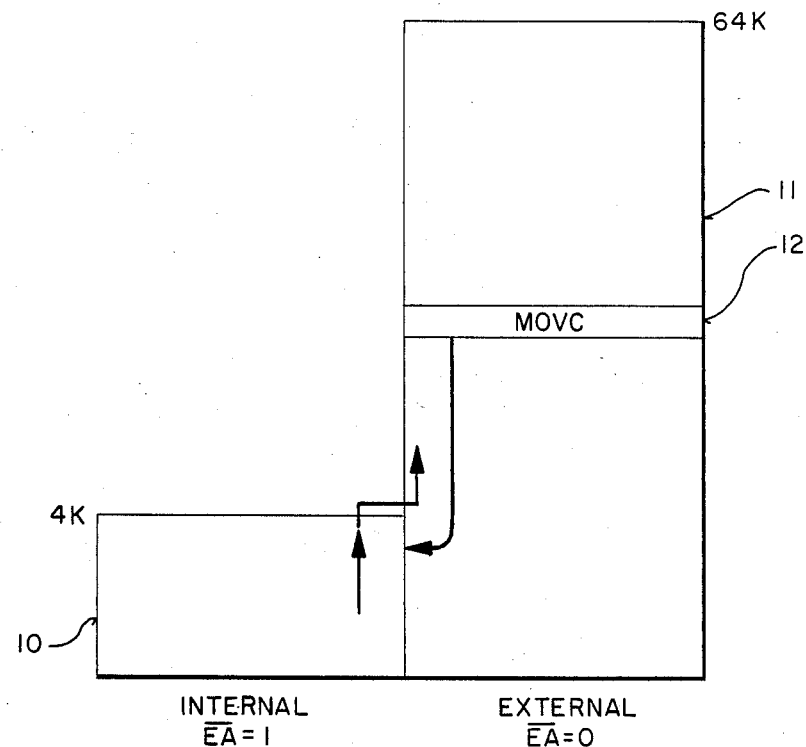
FIG_1
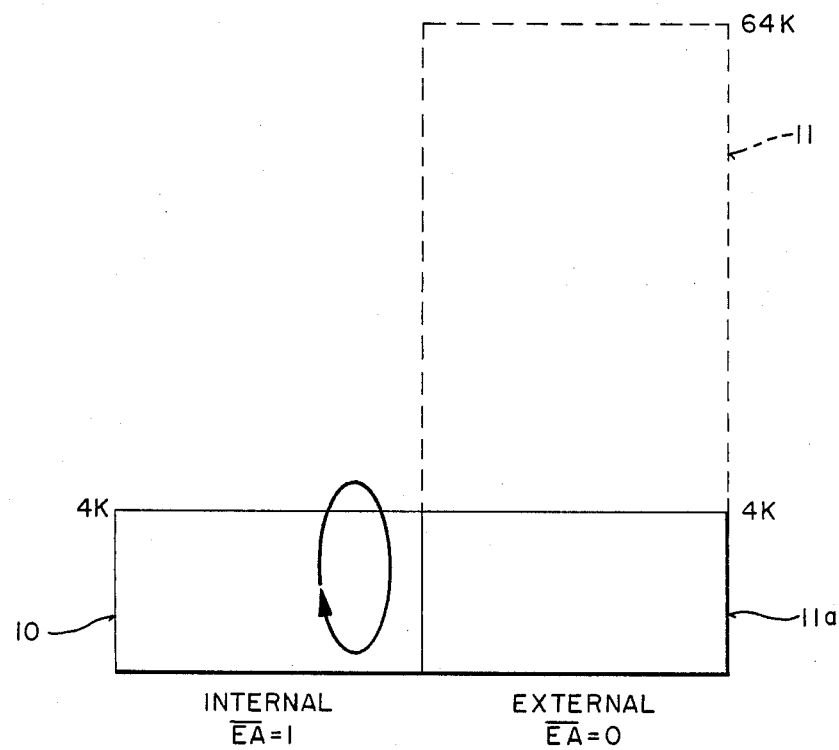
FIG_2

FIG_3
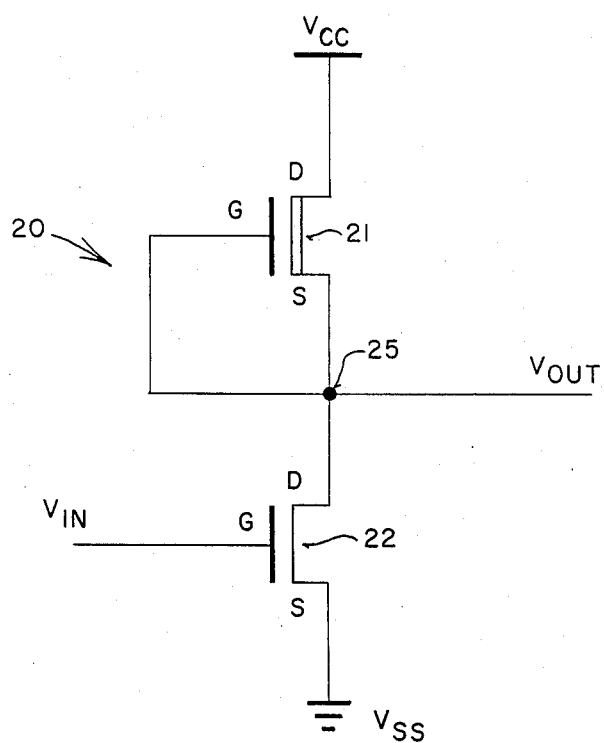
FIG_4
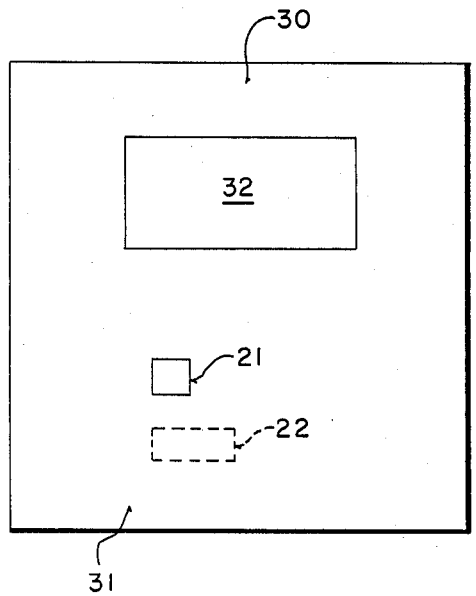
FIG_5
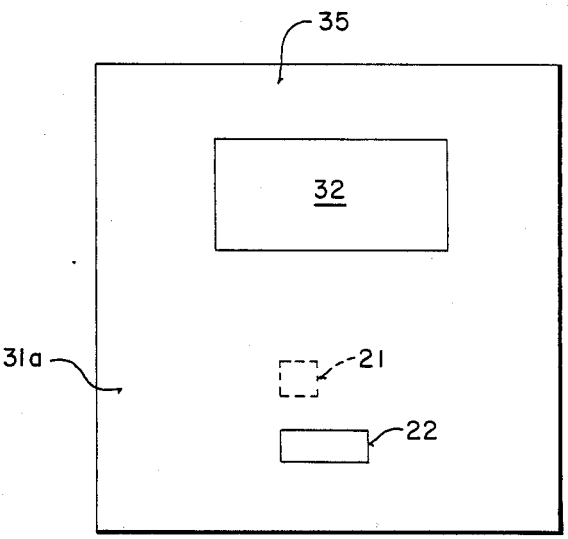

FIG_6
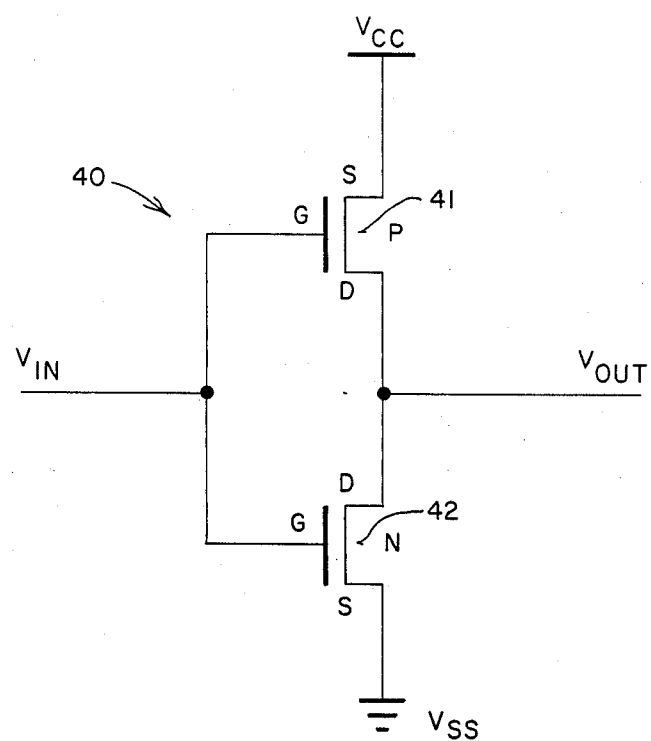
FIG_7
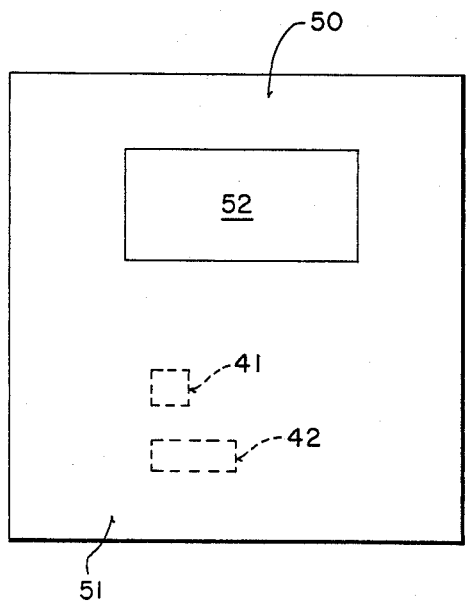
FIG_8
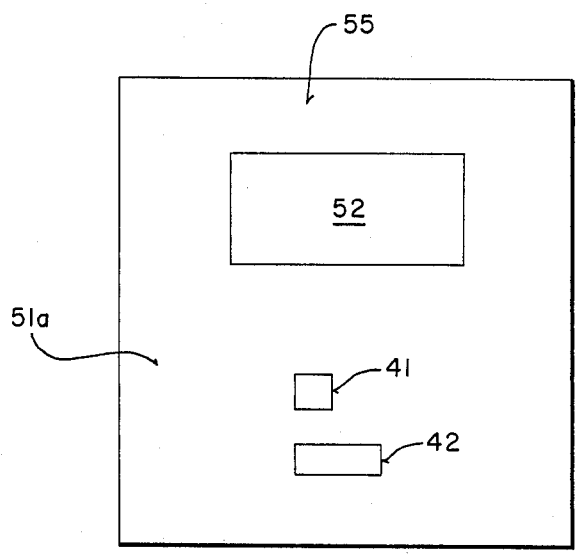

ARCHITECTURE MODIFICATION FOR IMPROVED ROM SECURITY

BACKGROUND OF THE INVENTION

1. Field of the Invention

The present invention relates to the field of computer program protection techniques and more specifically to preventing access to mask programmed ROM code.

2. Prior Art

In the area of digitally programmable control devices, microcontrollers are used to provide microcomputer control of various devices. A typical microcontroller is comprised of a microprocessor and an associated memory for storing a program code to be utilized by the microprocessor. Normally, the associated memory used with the microprocessor is an on-chip read only memory (ROM). Also included on-chip are peripheral units such as timers, counters, serial channel interfaces and random access memory (RAM).

Typically, a customer will provide a set of programming instructions to the manufacturer of the microcontroller device and the manufacturer will microcode the ROM during the manufacturing process. The technique of "mask programming" is used to microcode a mask layer during the fabrication of the microcontroller chip.

By embedding the program on a single mask layer, only one mask layer need be customized to include the proprietary program code. Typically, in both NMOS and CMOS technology, a single ROM code mask layer provides the programming by varying the depletion ion implantation during this masking step. This mask "programs" the proprietary program code into the microcontroller device by making it unique to the individual customer.

In the prior art, this ROM code is readable by the user of the microcontroller device. Therefore, in the prior art, protection of the factory masked ROM code from piracy or other unauthorized copying is difficult to achieve. Users can gain access to the contents of the ROM code by using various techniques, including the published technique of utilizing the "verify" test mode. This "verify" test mode allows byte by byte verification of the ROM code by electrical means as specified in the data sheets of these microcontrollers. Alternatively, one instruction, MOVC (move code), when executed will fetch program instructions from memory external to the chip, but will also permit internal ROM code to be made accessible. For customers, such as video game manufacturers and cable TV providers who use ROM coded scramblers, secure controllers which prevent users from accessing the stored set of program codes is desired, so that ROM codes must be protected.

It is appreciated then that what is desired is an improved ROM security technique which can be implemented in a microcontroller having an associated on-chip memory for protecting the program code from being copied.

SUMMARY OF THE INVENTION

The present invention describes a technique of modifying a microprocessor architecture to provide improved ROM security. To prevent external access of the contents of an internal memory of a microcontroller integrated circuit chip, a driver circuit that couples command or address signals which permit accessing of the internal memory is disabled during the ROM masking step in the fabrication of the microcontroller chip. The ROM mask pattern is modified to permit implantation of the driver components so that the driver is permanently disabled wherein the control signals will have no effect on the drivers.

The same ROM mask is the single mask layer which is customized during the fabrication process to include the proprietary software. This mask is not modified for an unsecure device; however, pattern openings are modified if a secure device is desired. The pattern openings provide for implantation of the components comprising the driver circuit such that this driver circuit is permanently disabled. This same technique can be implemented in either NMOS or CMOS technology.

BRIEF DESCRIPTION OF THE DRAWINGS

FIG. 1 shows the program memory address space and illustrates a memory scheme which permits programming instructions from an external memory to access contents of an internal memory.

FIG. 2 shows one mapping scheme of the present invention for preventing external access of internal memory.

FIG. 3 is a circuit schematic diagram of a driver circuit using NMOS technology which is used to couple signals that permit external access of internal memory.

FIG. 4 is an illustration of a mask pattern used with the driver circuit of FIG. 3 when internal memory protection is not desired.

FIG. 5 is an illustration of a mask pattern used with the driver circuit of FIG. 3 when internal memory protection is desired.

FIG. 6 is a circuit schematic diagram of a driver circuit using CMOS technology which is used to couple signals that permit external access of internal memory.

FIG. 7 is an illustration of a mask pattern used with the driver circuit of FIG. 6 when internal memory protection is not desired.

FIG. 8 is an illustration of a mask pattern used with the driver circuit of FIG. 6 when internal memory protection is desired.

DETAILED DESCRIPTION OF THE INVENTION

The present invention describes a technique of modifying a microprocessor architecture to provide improved ROM security. In the following description numerous specific details are set forth such as specific circuits, doping techniques, etc., in order to provide a thorough understanding of the present invention. It will be obvious, however, to one skilled in the art that the present invention may be practiced without these specific details. In other instances, well known processes and fabrication techniques have not been described in detail in order not to unnecessarily obscure the present invention.

Referring to FIG. 1, mapping of an on-chip internal memory 10 and an external memory 11 associated with a microcontroller of the present invention is shown. In this particular example, the preferred embodiment has 4K of internal memory and 64K of external memory 11. The internal memory 10 is typically a read-only-memory (ROM). The program code is provided as ROM code and resides within internal memory 10. In most instances the storage capacity of the internal memory is much less than that of the external memory 11. This is shown in the example of FIG. 1 by the storage capacity of 4K for the internal memory 10 and a storage capacity of 64K for the external memory 11. It is to be appreciated that the size of the memories 10 and 11 is arbitrary and is presented here in specific values for illustrative purpose only. Further, the present invention is capable of being used without the requirement of the external memory 11.

The external memory 11, typically a random-access-memory (RAM), is external to the microcontroller device and is designed to be accessed by the user for various storage functions. An external access signal, EA, is utilized to determine which memory 10 or 11 will be accessed by the system. When EA equals "one" internal memory is accessed and when EA equals "zero" external memory is accessed.

An ideal situation is when internal memory 10 is designed so that a user is prevented from accessing the internal memory when he is executing program code from the external memory. However, due to the architecture of most microcontroller devices, which includes clearly defined programming language instruction sets, instruction statements, such as a move code (MOVC) instruction 12 can reside within the external memory 11, for accessing locations within internal memory 10.

Although, such instructions 12 can be removed from the instruction set of the microcontroller to prevent access to the internal memory 10, such removal will severely restrict the use of the microcontroller to perform its function. Further, in many instances, it is desirable to access internal memory by the user.

With EA=1, the program will execute from internal memory 10. Once the microcontroller execution exceeds the 4K limit of internal memory 10, it will "roll over" into external memory 11. External memory 11 may then contain a MOVC code (MOVC) instruction 12 that will allow access of internal memory 10. Ideally, what is desired is a device having the memory structure shown in FIG. 1 for general use, but whenever ROM security is desired, the device of FIG. 1 is altered to restrict access to internal memory 10.

Referring to FIG. 2, a technique to limit the access of the internal memory 10 is shown. By limiting the external memory 11 to 4K (shown by reference 11a), when the microcontroller exceeds the internal 4K limit, it will "roll over" within the internal memory 10. If EA is an "0", a MOV instruction will access only external memory 11a itself. In this instance, the proprietary software stored within internal memory 10 is to be kept secret and therefore access prevention is achieved. Video game programs or cable TV scrambler programs are examples of programs which will reside within internal memory 10. In most instances, customers wanting a copy protected ROM will sacrifice storage capacity of the external memory in order to derive copy protection.

In the example of FIG. 2, if the external memory 11 is reduced in capacity to equal or less than the internal memory 10, as shown by reduced external memory 11a having a capacity of 4K, instructions such as MOVC cannot reside in the external memory for accessing internal memory 10. That is, MOVC instruction within memory 11a cannot access contents stored within internal memory 10. Therefore, by taking the microcontroller device of FIG. 1 and by limiting the external memory 11 addressable by the microcontroller, the external memory 11 is prohibited from accessing the internal memory 10. The reduction of memory 11 to a 4K storage space as shown by 11a is simply accomplished by disabling the upper four address bits. In the instance, external memory 11 is not needed at all, external memory 11 or 11a can be removed altogether by disabling the external memory address lines.

Further, a test mode, such as VERIFY, is disabled so that users cannot use VERIFY to access contents of internal memory 10. In a standard microcontroller part, VERIFY is used to read the contents of the internal memory 10 after fabrication to determine the accuracy of the contents stored within internal memory 10.

When a secure device is desired, the standard architecture of FIG. 1 is modified to that shown in FIG. 2 by reducing the external memory 11 to the same storage capacity as that of internal memory 10 by disabling the most significant address bits. Further, VERIFY is permanently disabled so that it cannot be used to read the contents of the internal memory 10. Thee modifications are achieved during the fabrication of the device and, therefore, the implementation of security is in the actual hardware. The hardware cannot be altered once it has been fabricated. Because the test mode has been disabled, the contents of memory 10 cannot be read out of the microcontroller. A verification of the internal program is simply accomplished by having a built-in self-check routine within the program, such that certain results achieved by the program can be readily reviewed for comparison with expected results to test for errors introduced during manufacture of the device. This self-check technique is well known in the prior art.

HARDWARE IMPLEMENTATION

The technique of modifying a microprocessor architecture for providing the improved ROM security by converting from a standard non-secure device to a secure device is achieved by modifying a single ROM mask layer. That is, a single making layer is used to provide the formation of the mask program, and in which a modification to provide a secure device is achieved also during this masking stage. The technique used to alter the architecture modifies the areas in an inverter circuit before a depletion implant is to occur. By keeping the change only to the ROM coding mask, the change is implemented at this stage and is transparent to the factory flow in fabricating the device. Restated, in the manufacture of a standard part, all of the factory procedures are the same except for the step of providing the customized ROM code in the ROM mask. At this ROM masking step, a customized mask is prepared to embed each program code in the program memory. The technique of the present invention slightly modifies this ROM mask to provide the necessary security for providing copy protection to the standard part.

Referring to FIG. 3, a typical inverter circuit 20 is shown having a load transistor 21 and a driver transistor 22 coupled in series between Vcc and Vss. The inverter 20 uses NMOS technology, wherein transistor 21 is typically a depletion device. Depending on the signal input $V_{IN}$ at the gate of transistor 22, $V_{OUT}$ at the juncture of the two transistors 21 and 22, labelled node 25, is pulled up to Vcc by transistor 21 or pulled down to Vss by transistor 22. Typically, inverter 20 is used to provide an output from the microcontroller device. The test mode signal, as well as address lines, described earlier in reference to FIGS. 1 and 2, are each coupled from the microcontroller device through such inverters as shown in FIG. 3 as $V_{IN}$.

To inhibit the test mode signal, such as the VERIFY signal, and the foremost significant address bits, the inverter 20 for each of these signal lines are disabled, such that the output $V_{OUT}$ is disabled. In effect, signal $V_{IN}$ cannot toggle inverter 20 and $V_{OUT}$ remains fixed. The inverter 20 of FIG. 3 is disabled by forcing node 25 to be permanently pulled down to Vss. The preferred embodiment disables inverter 20 by forcing node 25 to be forced to Vss. This is achieved by effectively turning off depletion transistor 21 and turning on enhancement transistor 22. The technique of the present invention is to change the depletion implant during the depletion mask used for ROM coding.

Referring to FIG. 4, a mask layer 30 for a certain hypothetical device is shown having a core section 31 and ROM coding section 32. Mask layer 30 is typically called a ROM mask. For a given standard microcontroller device, core section 31 remains unchanged. ROM coding section 32 of the mask will vary according to the custom ROM coding of the proprietary program. Hence, core section 31 of the mask 30 remains constant while the ROM coding section 32 varies, reflecting the different programs which will be embedded as program code in the microcontroller device. To provide the inverter 20 of FIG. 3 for a standard non-secure device, a portion of the mask over load device 21 is open, as shown by the solid line, so that device 21 can be implanted to provide a depletion device. Transistor 22, which is the driver device, is unimplanted and is therefore shown by a dotted line to show that it is covered by the mask 30.

Now referring to FIG. 5, to implement the security device of the present invention, a slightly different ROM mask 35 is used. Mask 35 is comprised of core section 31a and ROM coding section 32. It is to be noted that ROM coding section of a secured and unsecured devices are the same because the program itself doe not change from one device to the other. Instead, with the secured device the mask 31a covers transistor 21 but is uncovered over driver transistor 22. In this instance transistor 21 is not implanted, as was the case in FIG. 4, but transistor 22 is implanted. This reverse implantation of the two transistors causes transistor 21 to be a weak or unimplanted device and the enhancement type transistor 22 is now a low-power depletion type device because of the implantation. The new combination causes a change in the turn-on threshold of transistors 21 and 22. In this instance, transistor 21 is perpetually turned off and transistor 22 is perpetually turned on, such that node 25 is always at $V_{ss}$ potential.

Therefore by simply changing the implantation step which is achieved during the ROM coding step, a single mask layer is used to determine the fabrication of a secure or a unsecure device. It is to be noted that the section of the mask pertaining to the microprogramming does not change. The actual difference in the masks 30 and 35 which pertain to the implantation of transistors 21 and 22 is in the core section 31a of the mask itself.

Because in the manufacture of custom chips, only one mask 30 or 35 need to be different to provide custom proprietary programming. A substitution of mask 35 for mask 30 during the manufacturing process to provide a secure device occurs at this step and is transparent to the manufacturing process. A similar and equivalent ROM coding mask change is implemented to provide a secure device using CMOS technology.

Referring to FIG. 6, a CMOS inverter 40 is shown having a p-channel pull-up transistor 41 and a n-channel pull-down transistor 42 coupled in series between $V_{cc}$ and $V_{ss}$. An input line is coupled to the gates of transistors 41 and 42. The drains of transistors 41 and 42 are coupled to the output line, source of transistor 41 is coupled to Vcc and the source of transistor 42 is coupled to Vss. In a typical inverter operation $V_{OUT}$ will be coupled to Vcc or Vss due to the conduction of one or the other (but not both) of transistors 41 or 42, respectively, depending on the input voltage $V_{IN}$.

FIG. 7 shows a ROM mask 50 having a core section 51 and ROM coding section 52. The mask 50, representing an unsecure device, has no openings to expose devices 41 and 42. This is because in a typical CMOS inverter, the transistors are not depletion implanted. However, if a secure device is desired, the ROM mask 55 of FIG. 8 is used.

In FIG. 8 a ROM mask 55 having core section 51a and ROM coding section 52 is shown. Again, as was the case with the earlier masks 30 and 35 for the NMOS devices, ROM coding section 52 remains unchanged because the program set is not altered. Instead, openings are provided for devices 41 and 42 such that during this masking step, devices 41 and 42 are both depletion implanted. By coding the depletion implant over the n-channel pull-down device, it becomes a low power type device that is always turned on. And by also coding the depletion implant over the p-channel pull-up device, that device will become a p-channel device with very negative (large magnitude) threshold voltage that is always off. The inverter transfer characteristics is such that the output will always be pulled down to Vss. An advantage of using this method over simply shortening the $V_{OUT}$ node to ground with a wiring connection is that this method will not draw appreciable current even when the input is at a logic zero. Again as was the case with the NMOS device, the masking change is accomplished in a single mask layer 55 which incorporates the program code. Because this masking layer 55 must be changed for each proprietary set of programs, providing additional openings in the mask for implanting the CMOS devices is quite transparent to the manufacturing process.

It is to be appreciated that the present invention provides a highly flexible scheme for protecting programs stored in ROM from access to prevent unauthorized copying. It is highly flexible in that a microcontroller device can be manufactured to provide the special ROM protection by embedding the protection scheme in the hardware itself. Further, this special protection is achieved due to an implantation change provided in a single masking step, which masking step also incorporates the unique ROM coding for a given program set. Because this mask layer will need to be custom made for each unique program set, changing the mask slightly to incorporate the secure function will not require additional mask layers and in the fabrication procedure, is quite transparent to the factory flow of the device. The security scheme is embedded in the hardware associated with the output of the device and is not in the program code itself, so that the ROM coding provided for the program need not be altered.

Thus, a novel method for protecting a mask programmed ROM code for a microcontroller is described. It is to be appreciated that although the preferred embodiment is described in conjunction with a microcontroller, this ROM protection technique can be implemented with other microprocessor devices as well.

We claim:

1. In a semiconductor device which includes a processor and an associated program memory and wherein said memory is programmed by program code during fabrication of said device, a method of preventing external access of said memory comprising the steps of:

patterning initially a coding mask layer wherein openings in said coding mask layer provide for implantation of underlying areas, said initial patterning providing said coding mask layer which provides coding of a predetermined program and an associated circuit which permits external access of said memory;

modifying said coding mask layer to provide a modified pattern which still provides coding of said predetermined program, but disables said associated circuit to prevent external access of said memory;

using said modified coding mask layer during fabrication of said device, wherein said associated circuit which permits external access of said memory is permanently disabled.

2. The method of claim 1, wherein the step of using said modified coding mask layer includes the step of disabling a driver of said associated circuit.

3. In an integrated circuit having a processor and an associated internal memory, and wherein said internal memory is permanently programmed by a predetermined program code during fabrication of said integrated circuit to provide programming of said integrated circuit, a method of preventing external access to read contents of said memory comprising the steps of:

patterning a mask layer to pattern openings in said mask layer to permit implantation of regions underlying said openings; said patterning providing coding of said program code and also providing a circuit pattern for an associated circuit which permits external access of said memory;

modifying said circuit pattern of said mask layer to permit implantation modification of said associated circuit to prevent external access of said internal memory without changing said program code;

using said modified mask layer during fabrication of said integrated circuit, wherein preventing external access provides, said program code to be copy protected.

4. In a microcontroller integrated circuit chip having a processor and an associated memory, wherein said associated memory provides a microcoded program for said processor, said microcontroller also having an associated circuit, comprised of a driver transistor and a load transistor using NMOS technology, which output contents of said associated memory externally of said chip, a method for disabling said driver transistor to prevent external output of said microcoded program, comprising the steps of:

modifying a mask pattern opening of a memory mask to change implantation of said driver transistor;

disabling said driver transistor without changing said microcoded program by causing said driving transistor to permanently conduct and said load transistor permanently not to conduct.

* * * * *

UNITED STATES PATENT AND TRADEMARK OFFICE
CERTIFICATE OF CORRECTION

PATENT NO. : 4,843,026
DATED : 06/27/89
INVENTOR(S) : Ong et. al.

It is certified that error appears in the above-identified patent and that said Letters Patent is hereby corrected as shown below:

| COLUMN | LINE | DESCRIPTION |
|--------|------|-------------|
| 04 | 34 | delete "making" insert --masking-- |
| 05 | 34 | delete "doe" insert --does-- |

Signed and Sealed this

Third Day of July, 1990

Attest:

HARRY F. MANBECK, JR.

Attesting Officer

Commissioner of Patents and Trademarks